US009369127B1

(12) United States Patent
Nickson et al.

(10) Patent No.: US 9,369,127 B1
(45) Date of Patent: *Jun. 14, 2016

(54) METHOD AND APPARATUS FOR GENERATING PIEZOELECTRIC TRANSDUCER EXCITATION WAVEFORMS USING A BOOST CONVERTER

(71) Applicant: Maxim Integrated Products, Inc., San Jose, CA (US)

(72) Inventors: Paul Nickson, Newton (GB); Arshad Suhail Farooqui, Westberkshire (GB); Lee Coleman, Berkshire (GB); Muhammad Umair, Santa Clara, CA (US); Roberto Alini, Dublin, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/481,562

(22) Filed: Sep. 9, 2014

Related U.S. Application Data

(62) Division of application No. 12/986,905, filed on Jan. 7, 2011, now Pat. No. 8,854,319.

(51) Int. Cl.
G06F 3/00 (2006.01)
H03K 17/96 (2006.01)
H02M 3/335 (2006.01)
G06F 3/01 (2006.01)

(52) U.S. Cl.
CPC .............. *H03K 17/964* (2013.01); *G06F 3/016* (2013.01); *H02M 3/33507* (2013.01)

(58) Field of Classification Search
None
See application file for complete search history.

(56) References Cited

U.S. PATENT DOCUMENTS

| 4,527,096 A | 7/1985 | Kindlmann |
| 4,537,353 A | 8/1985 | Speranza |
| 4,754,385 A | 6/1988 | McDade et al. |
| 4,868,730 A | 9/1989 | Ward |
| 5,036,263 A | 7/1991 | Yamada et al. |

(Continued)

FOREIGN PATENT DOCUMENTS

WO          9743825          11/1997

OTHER PUBLICATIONS

International Search Report dated Dec. 3, 2009, in International Application No. PCT/US09/61359, filed Oct. 20, 2009, Maxim Integrated Products, Inc.

*Primary Examiner* — Antonio Xavier
(74) *Attorney, Agent, or Firm* — North Weber & Baugh LLP

(57) ABSTRACT

Transducers formed as part of a touchscreen system emulate the motion of a pushbutton or other mechanical elements. A touchscreen system positions a transducer adjacent to an icon displayed on the touchscreen surface. When a user touches the icon, the transducer senses the touch and is then deformed in a pattern that emulates a mechanical motion, giving the user the sensation of touching a mechanical button. An excitation signal applied to the transducer is compared to a target excitation signal that, when applied to the transducer, causes the transducer to emulate the desired motion. When any differences between the two signals are detected, the excitation signal is adjusted so that the motion is corrected. The target excitation signal, or time and voltage segments defining it, are stored in memory and retrieved for comparison. The excitation signal is also selected to reduce any acoustic artifacts that can cause the transducer to generate audible clicks.

14 Claims, 7 Drawing Sheets

(56) References Cited

U.S. PATENT DOCUMENTS

| | | |
|---|---|---|
| 5,313,141 A | 5/1994 | Kimball |
| 5,463,283 A | 10/1995 | Sanderson |
| 5,543,679 A | 8/1996 | Morino et al. |
| 5,570,278 A | 10/1996 | Cross |
| 5,709,219 A | 1/1998 | Chen et al. |
| 5,789,870 A | 8/1998 | Remson |
| 6,011,702 A | 1/2000 | Gueyski |
| 6,466,036 B1 | 10/2002 | Philipp |
| 6,937,124 B1 | 8/2005 | Nakamura et al. |
| 7,061,327 B2 | 6/2006 | Doy |
| 7,176,753 B2 | 2/2007 | Noda et al. |
| 7,283,120 B2 | 10/2007 | Grant |
| 7,554,821 B1 | 6/2009 | Collmeyer et al. |
| 7,667,371 B2 | 2/2010 | Sadler et al. |
| 8,854,319 B1* | 10/2014 | Nickson .......... G06F 3/016 340/407.1 |
| 2003/0067449 A1 | 4/2003 | Yoshikawa et al. |
| 2003/0174121 A1 | 9/2003 | Poupyrev et al. |
| 2005/0030292 A1* | 2/2005 | Diederiks .............. 345/173 |
| 2005/0043657 A1* | 2/2005 | Couvillon, Jr. .......... 601/134 |
| 2005/0073862 A1 | 4/2005 | Mednik et al. |
| 2005/0134561 A1 | 6/2005 | Tierling et al. |
| 2005/0219872 A1 | 10/2005 | Lys |
| 2005/0225202 A1 | 10/2005 | Vogeley et al. |
| 2006/0084856 A1 | 4/2006 | Biggins et al. |
| 2006/0119586 A1 | 6/2006 | Grant et al. |
| 2006/0169954 A1* | 8/2006 | Smela et al. .............. 252/500 |
| 2006/0267949 A1 | 11/2006 | Rosenberg |
| 2006/0279548 A1 | 12/2006 | Geaghan |
| 2007/0076448 A1 | 4/2007 | Usui |
| 2007/0097073 A1 | 5/2007 | Takashima et al. |
| 2007/0159865 A1 | 7/2007 | Iwamoto et al. |
| 2007/0229455 A1 | 10/2007 | Martin et al. |
| 2007/0265140 A1* | 11/2007 | Kim et al. .......... 482/8 |
| 2007/0268009 A1 | 11/2007 | Duan |
| 2007/0273681 A1 | 11/2007 | Mayell |
| 2008/0055277 A1 | 3/2008 | Takenaka et al. |
| 2008/0062145 A1 | 3/2008 | Shahoian et al. |
| 2008/0068192 A1 | 3/2008 | Ashdown et al. |
| 2008/0088262 A1 | 4/2008 | Bolz |
| 2008/0192514 A1 | 8/2008 | Zhou et al. |
| 2009/0051247 A1* | 2/2009 | Kakehi et al. .......... 310/316.03 |
| 2009/0072662 A1 | 3/2009 | Sadler et al. |
| 2009/0079550 A1 | 3/2009 | Makinen et al. |
| 2009/0095821 A1 | 4/2009 | Feriani et al. |
| 2009/0135142 A1 | 5/2009 | Fu et al. |
| 2009/0147546 A1 | 6/2009 | Grande et al. |
| 2009/0189873 A1 | 7/2009 | Peterson et al. |
| 2009/0244017 A1 | 10/2009 | Pala et al. |
| 2009/0284485 A1 | 11/2009 | Colgate et al. |
| 2010/0001618 A1* | 1/2010 | Fukagawa et al. .......... 310/317 |
| 2010/0156823 A1 | 6/2010 | Paleczny et al. |
| 2010/0188327 A1 | 7/2010 | Frid et al. |
| 2010/0207895 A1 | 8/2010 | Joung et al. |
| 2011/0062870 A1 | 3/2011 | Kanbara |
| 2011/0095877 A1 | 4/2011 | Casparian et al. |
| 2011/0260990 A1 | 10/2011 | Ali |
| 2011/0261005 A1 | 10/2011 | Joharapurkar |
| 2011/0261006 A1 | 10/2011 | Joharapurkar |
| 2011/0261007 A1 | 10/2011 | Joharapurkar |
| 2011/0261008 A1 | 10/2011 | Joharapurkar |
| 2011/0310028 A1 | 12/2011 | Camp et al. |

* cited by examiner

METHOD AND APPARATUS FOR GENERATING PIEZOELECTRIC TRANSDUCER EXCITATION WAVEFORMS USING A BOOST CONVERTER

CROSS REFERENCE TO RELATED APPLICATIONS

This is a divisional of copending application Ser. No. 12/986,905, filed Jan. 7, 2011, which application is hereby incorporated herein by reference in its entirety and from which application priority is hereby claimed. The following co-owned, co-filed, and co-pending application Ser. No. 12/986,776, titled "Method and Apparatus for Improving Dynamic Range of a Touchscreen Controller;" application Ser. No. 12/986,841, titled "System for and Method of Transferring Charge to Convert Capacitance to Voltage for Touchscreen Controllers;" application Ser. No. 12/986,881, titled "Noise Cancellation Technique for Capacitive Touch Screen Controller Using Differential Sensing;" application Ser. No. 12/986,991, titled "System Integration of Tactile Feedback and Touchscreen Controller for Near-Zero Latency Haptics Playout;" and application Ser. No. 12/987,008, titled "Use of Random Sampling Technique to Reduce Finger-Coupled Noise," all applications of which are hereby incorporated herein by reference in their entireties.

A. FIELD OF THE INVENTION

This invention relates to human-to-machine interfaces. More specifically, this invention relates to haptic devices for touchscreens.

B. BACKGROUND OF THE INVENTION

Touchscreens, such as liquid crystal displays, are well suited for mobile telephones, 25 personal digital assistants, personal computers, and other compact devices. LCD touchscreens are desirable because their layered structure allows a single interface to both display output and receive touch inputs, a structure that reduces their footprint, weight, and cost. A user selecting an icon on a touchscreen surface may feel a vibration, confirming that the icon has been selected. These sensations are generally not pleasing to the touch and often generate annoying audible tones.

Many users enjoy particular tactile feedback, like the feel of a button depression. Unfortunately many touchscreen systems are not able to generate feedback that emulates particular mechanical inputs such as the pressing of a dome button. Moreover, it is infeasible to embed dome and other mechanical buttons in touchscreen systems, depriving the user of particularized tactile feedback.

SUMMARY OF THE INVENTION

In accordance with the invention, a system uses a deformable material to emulate the movement of a mechanical element, such as a pushbutton. The material is mounted so that its motion can be felt on the surface of a touchscreen. When the system senses a touch, excitation signals are automatically applied to the material, deforming the material in a pattern that emulates the motion of the mechanical element. The signals applied to the material are dynamically adjusted, such as by using an energy converter with a feedback loop, ensuring that the signals are applied to the material uniformly. This reduces acoustic artifacts generated by the moving material.

As one example a user touches an icon displayed on a touchscreen. The system senses the touch and, in response, deforms a transducer so that the user feels the "click" of a pushbutton. The transducer is deformed at a rate that ensures that the user does not hear an audible "click" or any other audible artifacts.

In a first aspect of the invention, a system for deforming a material includes a deformable material and a control system configured to dynamically adjust signals that deform the material according to a predetermined pattern. A liquid crystal display displays icons such that the pattern is sensed at the icons. A feedback loop monitors and adjusts the signals. Preferably, the feedback loop includes a fly-back boost converter and automatically controlled charge and discharge paths to the material.

A memory stores one or more digital representations of excitation waveforms for deforming the material according to the pattern. Preferably, the digital representations are a sequence of voltage and time segments.

The material forms part of a touch sensing element that when pressed triggers the signals to deform the material. The material can be any deformable material, such as a linear resonance actuator, a piezoelectric transducer, or any other electro-mechanical vibration transducer, to name only a few such materials. As soon as a touch on the material is sensed, the deformation is triggered. The deformation is triggered sufficiently quickly that a user touching the material senses that the pattern is generated immediately.

In a second aspect, a method of deforming a material includes dynamically adjusting an energy transfer rate of a fly-back boost converter using a feedback loop to thereby uniformly deform the material according to a predetermined pattern. The material is deformed at a rate such that acoustic artifacts, such as clicks, are inaudible to humans.

The energy transfer rate is dynamically adjusted by generating a peak primary charging current on the fly-back boost converter to generate voltages on the material and by tracking a voltage waveform applied to the material to a target voltage waveform. In one embodiment, the pattern emulates a pushbutton motion, but different waveforms can be used to emulate other motions.

In a third aspect, a method of deforming a material includes dynamically adjusting peak values of energy applied to a fly-back boost converter electrically coupled to the material to thereby deform the material according to a predetermined pattern with the pattern update rate at an inaudible frequency.

In a fourth aspect, a touchscreen device includes a liquid crystal display for displaying one or more icons, a touch sensing element, and a memory. The touch sensing element is configured to sense a touch on it and, in response, to move according to a predetermined pattern. The movement is transmitted to the one or more icons so that a user touching the icons senses the movement. The fly-back boost converter uses peak primary charging currents to generate voltages applied to the touch sensing element. The peak primary charging currents are dynamically adjusted. The memory stores digital representations of voltages used to drive the fly-back boost converter.

DETAILED DESCRIPTION OF THE PREFERRED EMBODIMENTS

In many human-machine interfaces, tactile feedback is useful. For example, in an application for a touch-sensitive display panel displaying a number of icons or virtual keys, it may be desirable to reproduce the "click" of a mechanical switch or button. Piezoelectric transducers can be used to perform this function.

Piezoelectric transducers are devices that accumulate charge in response to a mechanical strain. A suitably constructed transducer can replace a mechanical button. When pressed by a finger or stylus, the transducer generates a voltage that can be interpreted as a key press by other equipment.

This is a reversible effect. Mechanical strain can be induced by applying an electric field. A suitably constructed transducer excited by a voltage will bend, and this movement is sufficient to be easily felt by touch. When excited by suitably constructed voltage waveforms, various tactile impressions such as keyboard key depressions can be generated.

The most common material used in these applications is lead zirconate titanate (PZT). Transducers constructed with PZT require excitation voltages between 100V and 200V to generate convincing tactile impressions. Many of the applications for this effect are in battery powered hand-held equipment with battery voltages of about 4V. Some methods of generating and shaping high-voltage waveforms from the battery voltages is required. The most efficient way to do this is to use a boost converter. However, rather than use a step-up or boost converter to first generate a high-voltage power rail at or above the highest voltage required for the application, and then using a high-voltage amplifier, such as a Class D amplifier to drive the transducer with a pulse width modulated waveform, embodiments of the invention use a boost converter directly as a waveform generator, eliminating any need for a high-voltage amplifier.

In accordance with the principles of the invention, a linear voltage ramp rate is applied to a transducer to thereby deform it. In one embodiment, this result is achieved by using the peak current (IPEAK) as the control parameter for a boundary mode fly-back converter. Using a boundary mode fly-back converter with dynamic IPEAK control rather than a fixed value of iPEAK' or a discontinuous converter with duty cycle control, has the benefit of being the most energy efficient way to create the desired waveform. Transducer characteristics are often not well controlled in manufacturing. For example, the load capacitance presented to the waveform generator may vary from lot to lot, with temperature, with time, and with applied voltage. A further benefit of dynamic IPEAK control is that the system can adapt to a wide range of loads, thus relieving the user of the burden of characterization and set up. As explained more fully below, controlling an energy transfer rate using I PEAK' rather than using a constant energy transfer rate, results in a linear voltage transfer rate on the transducer.

Figure 1A:
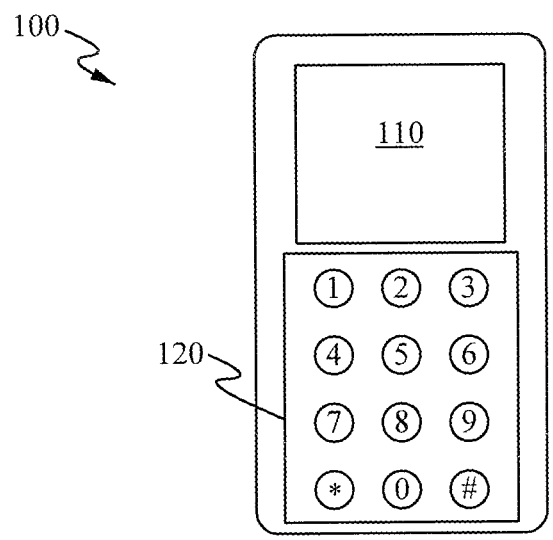
FIGS. 1A and 1B show, respectively, top and side cross-sectional views of a mobile telephone that uses deformable materials to emulate pushbutton motions in accordance with the invention.
Figure 1B:
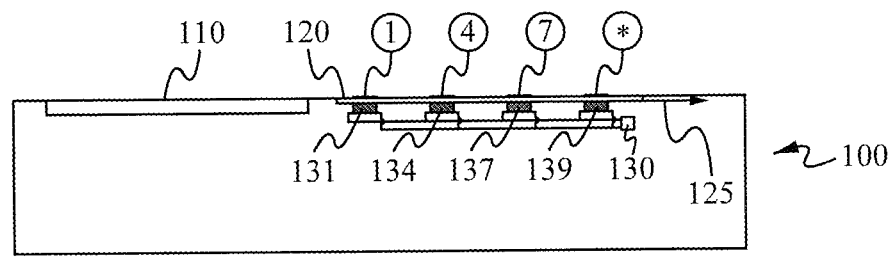

FIGS. 1A and 1B are top and side cross-sectional views, respectively, of a mobile phone 100 with a liquid crystal display keypad 120 that, in accordance with the invention, emulates the mechanical feel of pushbuttons. The mobile phone 100 includes a display screen 110, and the LCD keypad 120 displays icons of numbered buttons. When the user touches one of the icons, a transducer below the icon contracts so that the user, whose finger rests on the icon, senses the depression. In the side cross-sectional view, each of the icons is labeled with its key number (e.g., 1, 4, 7, and*) and overlies its own transducer (e.g., 131, 134, 137, and 139, respectively). As explained more fully below, when the system senses a finger or other object above one of the icons, control circuitry 130 depresses the area directly below the icon. When or soon after a button is "depressed," a corresponding pushbutton control signal is sent along the line 125 to the application that processes the pushbutton input.

While FIG. 1B shows multiple transducers 131, 134, 137, and 139, it will be appreciated that a single transducer can be used to generate a pushbutton motion. Furthermore, while FIG. 1B shows the transducers 131, 134, 137, and 139 all adjacent to corresponding icons, it will be appreciated that the transducers can be placed at other positions, so long as they generate motion sensed at an icon. As only some examples, a single transducer is mounted below or to the side of the touchscreen. On a small touchscreen, for example, a single transducer is capable of creating the pushbutton effect at different locations along the surface of the touchscreen. In this environment, the mounting position of the transducer is not critical. For a larger touchscreen, such as one used on an eReader, multiple transducers are used because they are better able to create the pushbutton effect at different locations along the touchscreen surface.

Figure 2:
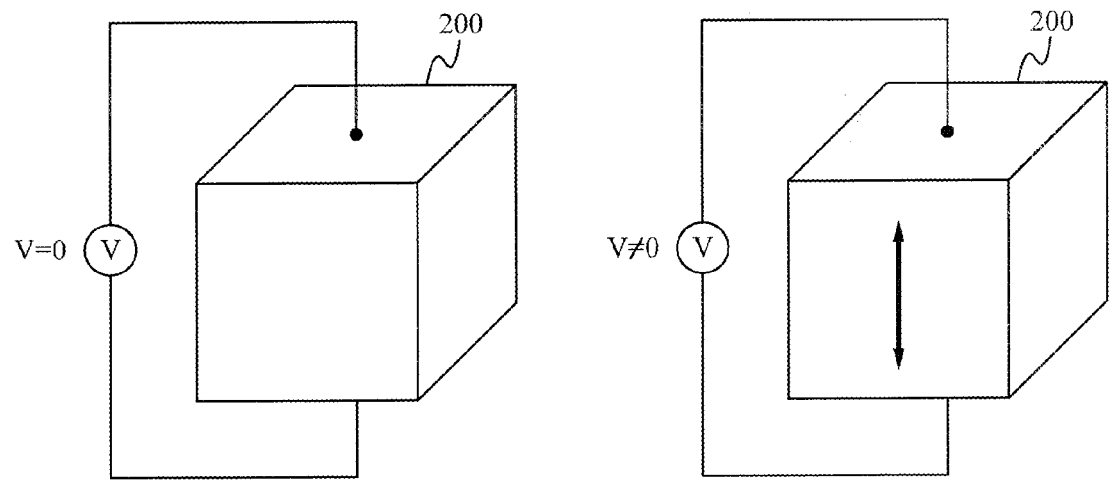
FIG. 2 is a schematic diagram of a deformable material with capacitive properties, used to explain the principles of the invention.

FIG. 2 is a schematic diagram of a piezoelectric transducer 200, used to illustrate the principles of the invention. FIG. 2 illustrates that the transducer 200 changes shape when a voltage is applied to it. Specifically, the transducer 200 expands when a positive voltage is applied to it and resumes its initial shape when the voltage is removed. In accordance with one embodiment of the invention, a transducer directly below a pushbutton icon is expanded slowly, so that a user touching the icon does not feel the movement, and then collapsed at a rate that allows the user to feel the movement. Feeling only the collapse, the user senses that the icon has been depressed.

Figure 3:
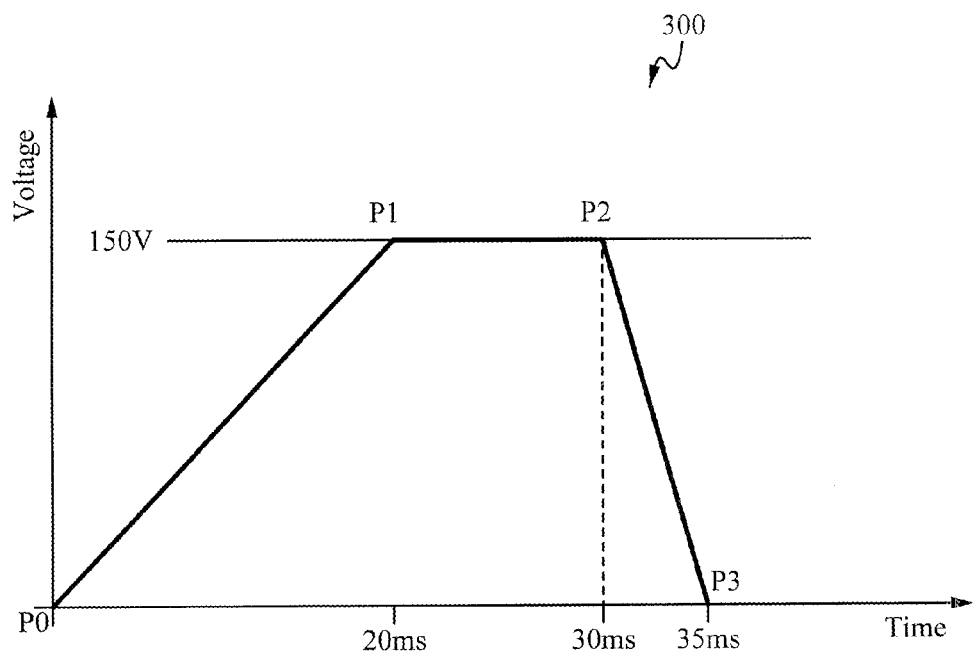
FIG. 3 is a graph of voltage versus time, where the voltage is applied to a transducer to deform it to emulate a pushbutton motion, in accordance with the principles of the invention.

FIG. 3 is a graph 300 of a voltage applied to a transducer versus time, in accordance with one embodiment of the invention. As shown in the graph 300, the voltage is increased from 0 V to 150 V from time 0 ms to 20 ms. At this rate, the transducer expands, but at a rate small enough that it cannot be detected by touch. During time 20 ms to 30 ms, the voltage is maintained at 150 V. From time 30 ms to 35 ms, the voltage is decreased from 150 V to 0 V, thereby contracting the transducer so that a user sensing the motion experiences the feel of the pushbutton being depressed.

Preferably, when the transducer is first touched, it triggers circuitry that causes the transducer to move with a predetermined motion. This process is easily implemented using piezoelectric transducers. When a piezoelectric transducer is pressed, the mechanical strain causes charge redistribution in it, which can be sensed as a terminal voltage. This voltage can be used as a trigger signal for the transducer excitation. The trigger signal initiates the transducer excitation with sufficiently low (predetermined) latency that the tactile effect appears to happen immediately.

As explained more fully below, some piezoelectric transducers produce an audible click (an "acoustic" artifact) when they expand at certain frequencies. For those applications in which a clicking sound during expansion is not desirable, the expansion rate from 0 ms to 20 ms should be chosen so that the artifacts of the calculation engine computation are ultrasonic so that they cannot be heard. In one embodiment, voltage is applied to a transducer with an update rate at a frequency above 26 kHz, a range inaudible to humans. Those skilled in the art will recognize other update rates that are inaudible and can be used in accordance with embodiments of the invention.

Figure 4:
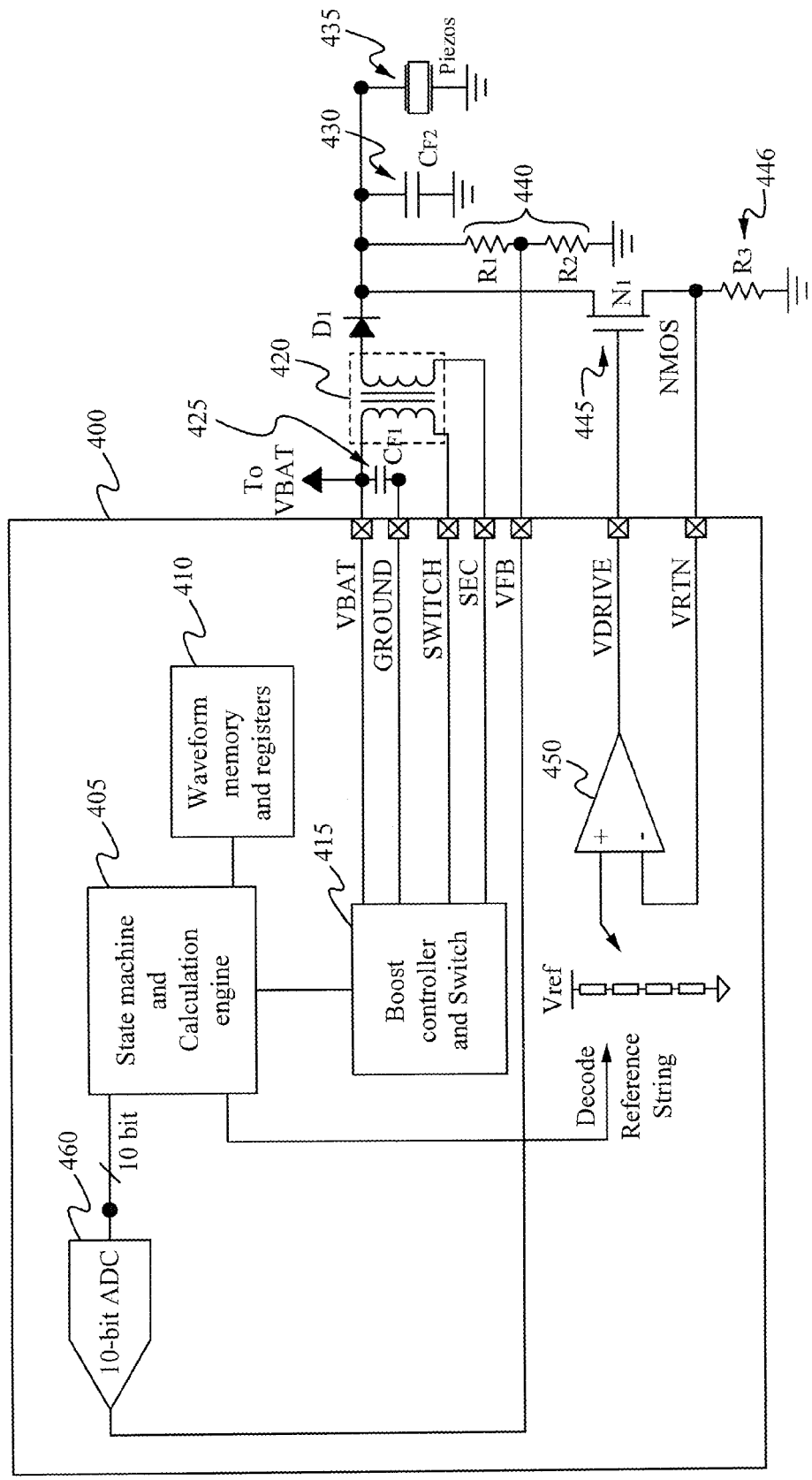
FIG. 4 is a schematic diagram of a circuit that generates current applied to a piezoelectric transducer to deform the transducer according to predetermined patterns, in accordance with the principles of the invention.

FIG. 4 shows a system 400 for deforming a piezoelectric transducer 435 according to a predetermined pattern, in accordance with one embodiment of the invention. As explained more fully below, the system 400 includes a boost converter that is used directly as a waveform generator, eliminating the need for a high-voltage amplifier. Rather than use a fixed reference voltage, embodiments of the invention use a dynamically generated signal that uses feedback to constrain the output to the desired waveform. Using feedback, the tolerances of the load capacitance, the transformer primary inductance, and other components are compensated.

The system 400 includes a boost controller and switch 415 that together drive a piezoelectric transducer 435 according to a predetermined pattern, such as to emulate the motion of a pushbutton. In one embodiment, the transducer 435 is positioned adjacent to a surface of a touch-sensitive display. In other embodiments, the transducer 435 is positioned below the touchscreen, to the side of the touchscreen, or at any other suitable location.

The boost controller and switch 415 are coupled to the transducer 435 through a transformer 420. The actual voltage on the transducer 435 is monitored using a voltage divider 440, whose output is converted to a digital value by a 10-bit analog-to-digital converter 460. The output of the ADC 460 is input to a state and calculation machine and calculation engine 405, which determines any difference between the actual voltage on the transducer 435 and the desired or target voltage needed to drive the transducer 435 in the predetermined pattern. The engine 405 compares the output voltage measured across the voltage divider 440 at regular time intervals with the desired values of voltage and time stored in a waveform memory 410. Based on these differences, the engine 405 computes appropriate boost or discharge parameters (when the output voltage is too low or too high, respectively), to ensure that the output voltage tracks the desired voltage within predetermined limits. When the actual voltage is smaller than the desired voltage, the engine 405 causes the boost controller and switch 415 to generate more charge to the primary of the transformer 420, which is ultimately transferred to the secondary of the transformer 420 and then stored on the transducer 435. When the actual voltage is larger than the desired voltage, the engine 405 causes a correction amplifier 450 to energize an NMOS switch 445, so that extra charge on the transducer 435 is shunted across the NMOS switch 445 to ground, bleeding charge from the transducer 435. In this way, the system forms a feedback loop to dynamically control the voltage on the transducer 435 to match a predetermined waveform, thereby causing the transducer 435 to deform according to a predetermined pattern. The FET 445 is a programmable constant current source that provides a controlled programmable discharge of the transducer 435.

Those skilled in the art will recognize other components shown in FIG. 4, such as a filtering capacitor 425 between the battery and ground pins of the boost and controller switch 415, a filtering capacitor 430 in parallel with the transducer 435, and a biasing resistor 446 at the base of the NMOS switch 445.

The system 400 stores waveforms and registers in a memory 410. The engine 405 reads these waveforms from the memory 410 and compares them to the actual waveforms on the transducer 435. In one embodiment, the waveforms are stored as segments or splines, with coordinates of time and voltage to control the step size in the reconstructed waveforms. The system then dynamically interpolates between these segments by adjusting the charging and discharging parameters of the system to determine actual points on the waveform. In some embodiments of the invention, the segments or splines are compressed to conserve memory. It will be appreciated that waveforms can be represented and stored in the memory 410 any number of ways to fit the application at hand.

In the examples discussed above, a transducer emulates a pushbutton motion. In this example, the waveform or segments of the waveform shown in FIG. 3 are stored in the memory 410.

Figure 5:
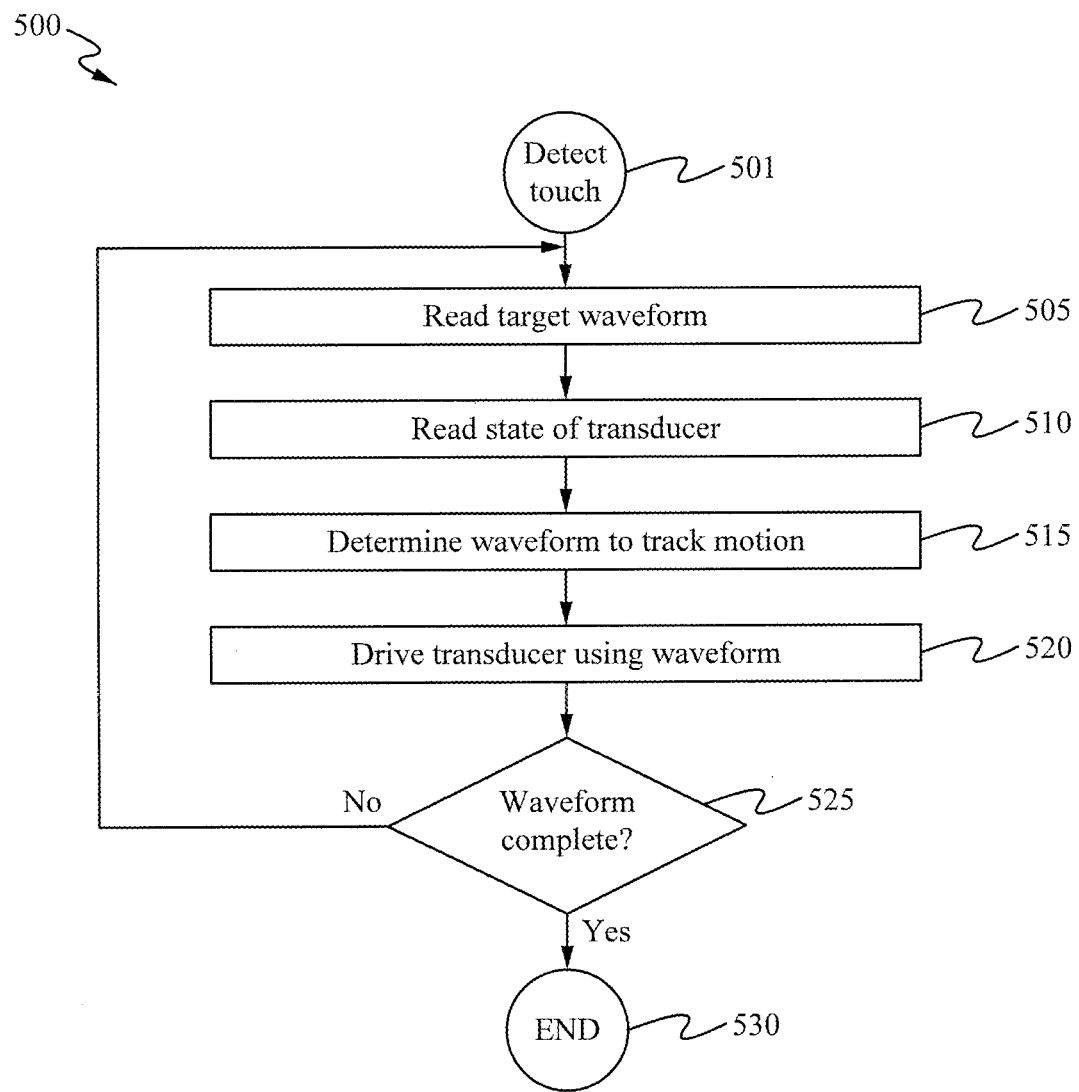
FIG. 5 is a flow chart of the steps of a process for driving a transducer to deform it according to predetermined patterns in accordance with one embodiment f the invention.

FIG. 5 shows the steps 500 of a process to drive a transducer, so that it moves according to a predetermined pattern. The transducer is positioned to sense a touch on an icon displayed on a touchscreen surface. In alternative embodiments, the touchscreen itself senses the touch to trigger the steps described below. The advantage of using the transducer for this purpose is the very low latency possible inasmuch as this signal can be used to trigger the stimulus without host processor intervention. This concept is described more fully in U.S. patent application Ser. No. 12/986,991, titled "System Integration of Tactile Feedback and Touchscreen Controller for Near-Zero Latency Haptics Playout," which has been incorporated by reference above.

In the step 501, the process detects a finger touching the icon. In the step 505, the process reads a desired or target waveform that, when applied to the transducer, moves the transducer according to the pattern. Next, in the step 510, the process reads a state of (e.g., charge on) the transducer. Initially, the transducer is in its initial state, uncharged. In the step 515, the process compares the state of the transducer with the desired waveform, computing a correction signal to make the actual signal track the desired charge within predetermined limits. In the step 520, the process drives the transducer with a correction signal. In the step 525, the process determines whether the transducer has been excited with the entire target waveform, that is, whether the desired pattern has completed. If the pattern has not completed, the process loops back to the step 503. Otherwise, the process continues to the step 530, where it ends.

It will be appreciated that the steps 500 of the process are merely illustrative. The steps 500 can be performed in different orders, some steps can be added, some steps can be deleted. As only one example, depending on the difference between the actual waveform and the desired waveform, an entirely new target waveform can be selected as part of the process.

Embodiments of the invention can be modified in any number of ways, to increase their efficiency and to reduce any undesirable side effects, such as audible clicking sounds generated by the transducer. To be completely convincing, the excitation waveform must not cause the transducer to create any audible artifacts during the initial slow ramp. Specific ways to do this are better understood after an explanation of how electro-mechanical loads move when excited by excitation pulses. As discussed below, some of these modifications depend on the peak current generated by a fly-back boost converter.

The charging time (T) for a capacitive load to a particular voltage in a boost converter is given approximately by:

$$T = \text{(Energy on capacitor/Energy on Inductor)} * \text{Frequency} * \text{Charging Efficiency}$$

Figure 6:
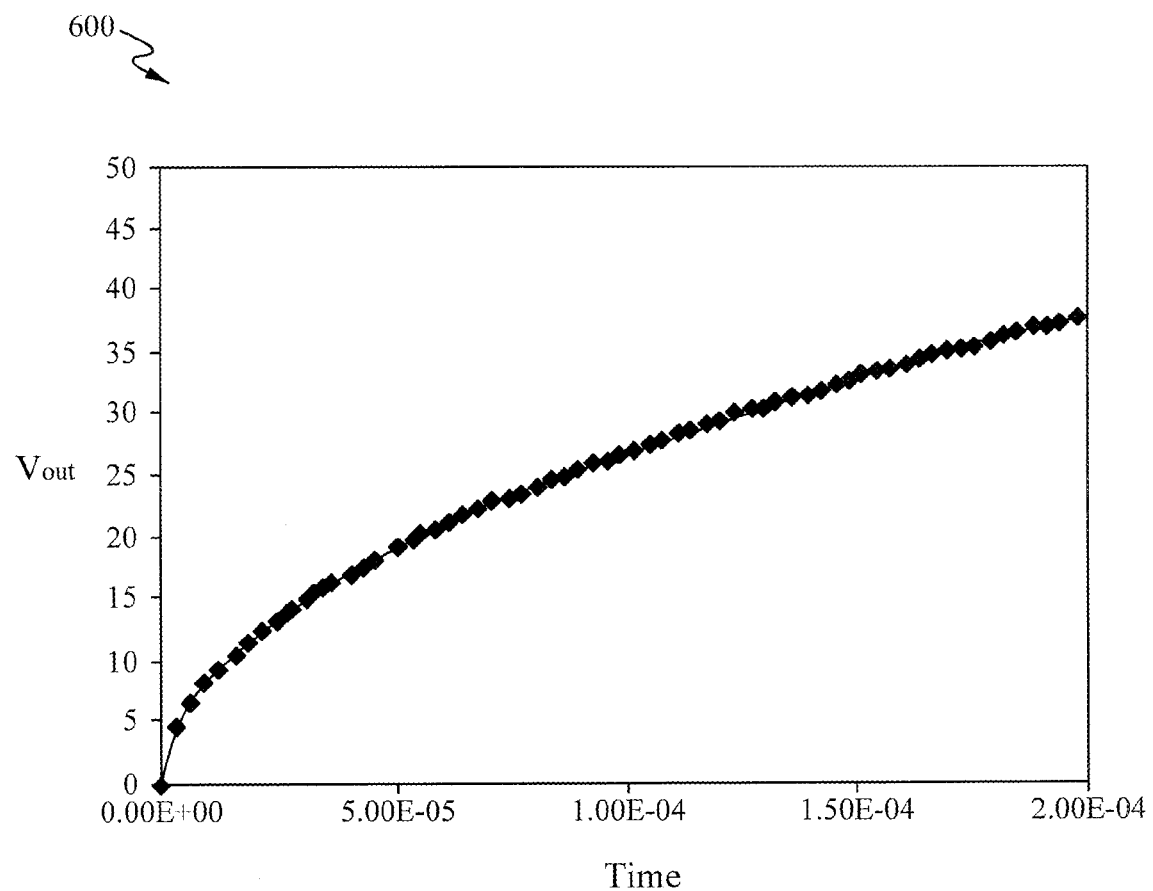
FIG. 6 is a graph of voltage versus time in a current controlled fly-back converter with a given peak charge current, used to explain the principles of the invention.

In accordance with one embodiment, the peak current that drives a transducer is dynamically controlled. It has been shown that driving a transducer with a high peak current and then increasing the voltage by incrementally smaller steps can have several drawbacks. The theory behind this is better understood with reference to FIG. 6, which shows a graph 600 plotting the output voltage in a current controlled fly-back converter with a given primary inductance. The graph 600 plots the open-loop charging characteristics of a capacitor using the fly-back converter.

In the graph 600, the initial output voltage is 0 V. The first five step sizes are relatively large compared to those for later steps. The voltage repeatedly overshoots the target voltage. In some systems, the charge becomes saturated at high voltages and the waveform undershoots the desired voltage. The step size depends on the boost converter frequency and the energy transferred per cycle. This is because the energy stored on a capacitor (E), the size of the capacitance (C) and the voltage across the capacitor is given by the equation:

$$E = 0.5 * C * V^2 \quad \text{Equation (1)}$$

Experiments show that the first steps can cause audible clicks that can detract from the tactile impression.

Figure 7A:
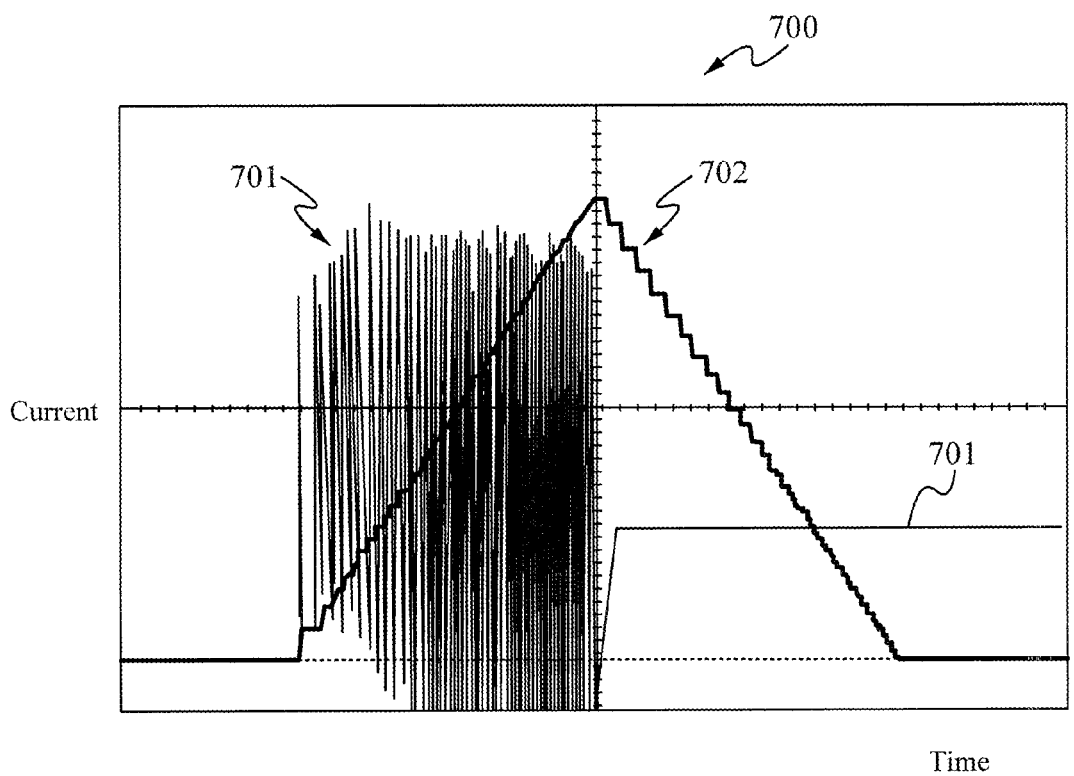
FIGS. 7A and 7B are graphs of the output of feedback tracking systems that track a triangle wave without and with adjusting the peak charge current, respectively, in accordance with one embodiment of the invention.
Figure 7B:
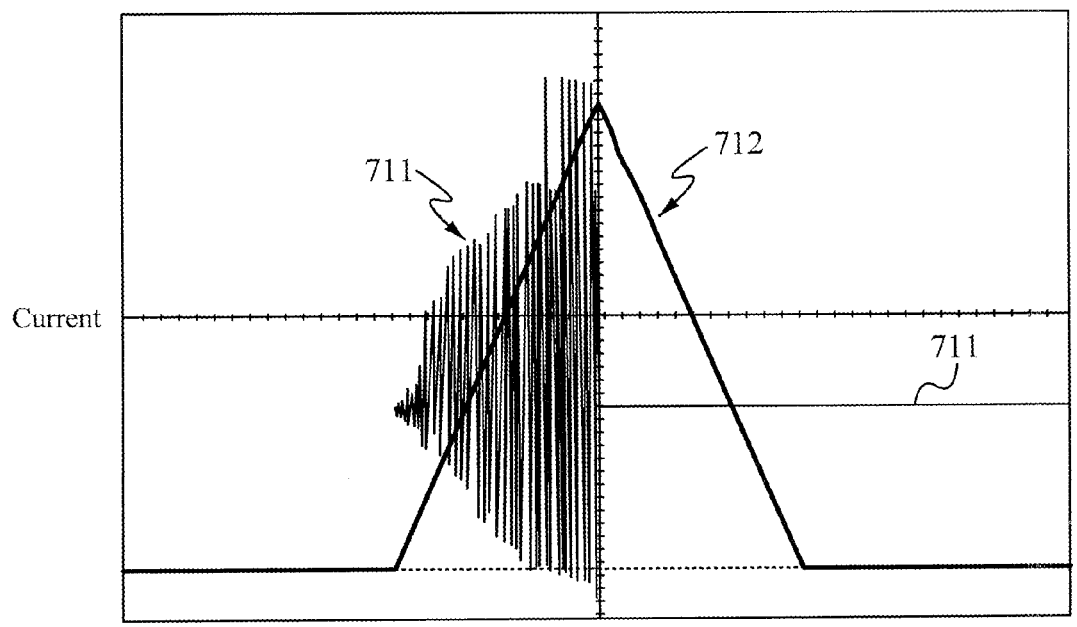

In accordance with the principles of the invention, the voltage transfer is controlled to decrease these audible clicks. Embodiments of the invention dynamically adjust IPEAK to minimize the initial energy transfer and thereby minimize the voltage steps and maximize the charge rates at high voltages. This effect can be appreciated by comparing the graph 700 in FIG. 7A with the graph 710 in FIG. 7B, both showing the output of a fly-back converter 5 tracking a simple triangle wave. The graph 700 plots the output of voltage 702 versus time without dynamically adjusting IPEAK 701, and the graph 710 plots the output voltage 712 versus time by dynamically adjusting I PEAK 711, in accordance with the principles of the invention.

In accordance with embodiments of the invention, a fly-back boost converter is programmed to start at a lower current setting. The output of this fly-back converter is shown in the graph 710. As shown in the graph 710, IPEAK is adjusted dynamically, starting at a low value to minimize the initial step size. The step size is gradually increased to maintain wave shape fidelity and maximize the charge rate at higher voltages. The system does not increment the current waveform unless it determines that the waveform will continually undershoot. If the system determines that it has undershot the waveform, it selects a different waveform, changing its settings to the boost converter. The system generates a dynamically controllable current to transfer energy to the transducer. In this way, the system behaves like a closed loop system. The fly-back boost converter free runs and is self-timed, adjusting IPEAK into the primary inductance in each cycle. The boost converter IPEAK value is adjusted dynamically and separately from the discharge path current (e.g., through the NMOS 445 in FIG. 4) to minimize the step size in the reconstructed waveform.

Figure 8:
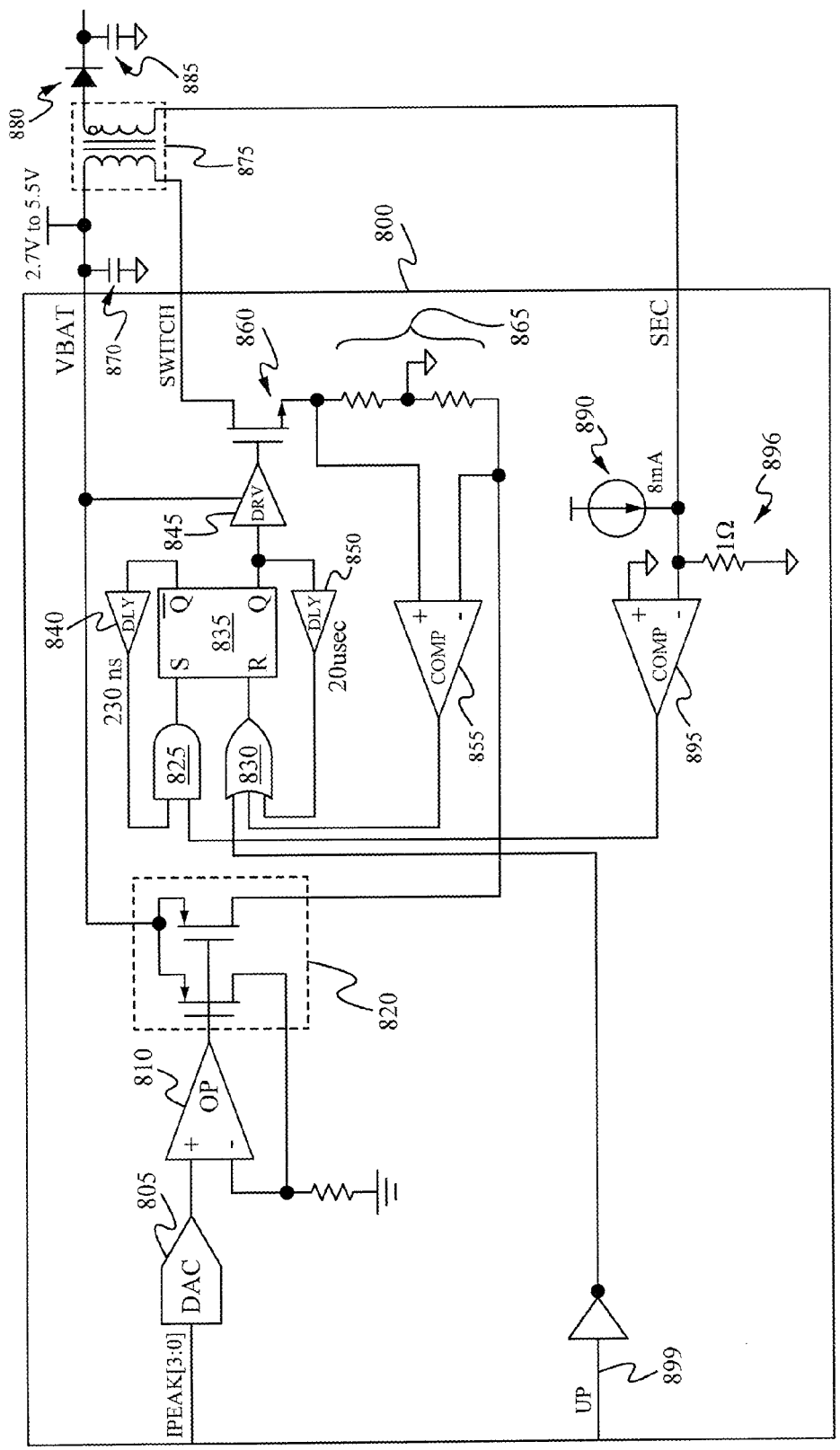
FIG. 8 is a schematic diagram of a hardware state machine for setting peak charge current in accordance with one embodiment of the invention.

FIG. 8 is a schematic diagram of a hardware state machine 800 for programming or setting I PEAK in accordance with one embodiment of the invention. The energy transfer rate is controlled by adjusting IPEAK as everything else is self-timed. The state machine 800 couples a charge to the secondary of a transformer 875 and thus to the capacitive load (e.g., a transducer) on the secondary. The structure of the state machine 800 is now explained in reference to its function.

An IPEAK input is translated into an analog value by a digital-to-analog converter 805, a value that is input to the negative terminal of an operational amplifier 810. The operational amplifier 810 generates an output that controls a ratiod PMOS circuit 820 and thus a current from the primary of the transformer 875 across a voltage divider 865. The voltage on a negative terminal of a comparator 855 is set by the IPEAK circuit. A drive circuit 845 drives a switch transistor 865 coupled to the primary of the transformer 875. When an UP signal is requested on the line 899, a flip flop 835 is toggled, switching the switch transistor 865 ON. The current across the voltage divider 865 will gradually increase, eventually equaling the IPEAK threshold that was set. The circuit will then toggle the flip flop 835 and turn the switch 865 OFF.

This sequence is self-timed. When a cycle has completed and an energy pulse of a fixed amount has been stored in the electromagnetic field of the circuit, the sequence stops. The comparator 895 then resets the whole sequence so that it can start again.

Once the current along the secondary of the transformer 875 drops below 8 mA, the voltage along the resistor 896 increases above ground and triggers the comparator 895, driving the AND gate 825 to set the flip flop 835. When the switch 865 is switched OFF, the voltage on the positive end of the transformer 875 increases and turns a diode 880 ON. The negative end of the transformer 875 is clamped by the resistor 896 so that it cannot drop too far below ground. Once the energy is delivered to the capacitor 885, the voltage on the resistor 896 increases. In other words, the conduction boundary is defined when the secondary current has decayed to 8 mA. The system ensures that no large negative voltages are input into the comparators. FIG. 8 shows various delays, capacitor values, all of which are merely illustrative of one embodiment of the invention.

The examples given above show waveforms used to drive a transducer to emulate specific motions. It will be appreciated that many types of motion can be emulated, such as those used in computer games to emulate explosions and the striking of a ball, and those that emulate the motion of polymer muscle fibers, to name only a few motions. After reading this disclosure, those skilled in the art will recognize how to determine, model, and track suitable waveforms in accordance with the principles of the invention.

It will also be recognized that a single system can be configured so that different transducers on a single touchscreen system emulate different motions. On such systems, a user touching different icons will experience different tactile feels.

In operation, a transducer simulates mechanical motions on a touchscreen surface so the user experiences tactile feedback. A system in accordance with the invention is triggered when it senses a touch on the touchscreen surface. The system applies a signal to the transducer so that its moves to emulate the motion, such as a pushbutton depression. Using a dynamic feedback loop, the system monitors the actual motion, compares it to the desired motion, and adjusts the signal to track the desired motion. For some applications, the system adjusts the signal so that the emulation does not generate clicking or other sounds.

Systems in accordance with the invention are efficient because the power supply itself is used to generate a desired waveform, without using an additional amplifier. By using a closed loop, with digital feedback, the system can track waveforms stored in memory. By controlling peak current and discharge, by dynamically adjusting energy transfer rates to equalize voltage steps, audible artifacts are minimized. Embodiments of the invention are also integrable. The high current primary switch can be integrated, separating the conflicting requirements of high voltage and high power operation, thus reducing cost.

Those skilled in the art will recognize that the examples given above can be modified in many ways. For example, while FIG. 4 shows a fly-back boost converter, it will be appreciated that any DC-DC step-up converter can be used in accordance with the invention. Furthermore, while piezoelectric transducers are discussed, it will be appreciated that any transducer sensitive to movement can be used, including electro-mechanical vibration transducers such as a linear resonance actuator. It will be readily apparent to one skilled in the art that other modifications can be made to the embodiments without departing from the spirit and scope of the invention as defined by the appended claims.

We claim:

1. A method of deforming a material comprising:
   dynamically adjusting a peak charging current to adjust an energy transfer rate of a DC-to-DC step up converter;
   applying according to a predetermined pattern a controlled charge to the deformable material; and
   providing an increasing energy transfer rate to reduce a voltage step size so as to adjust a waveform according to the predetermined pattern.

2. The method of claim 1, wherein dynamically adjusting the energy transfer rate comprises generating the peak primary charging current on a fly-back boost converter to generate voltages on the material.

3. The method of claim 2, wherein the fly-back boost converter is located in a feedback loop that is used to monitor and adjust the peak charging current.

4. The method of claim 1, wherein dynamically adjusting the energy transfer rate comprises tracking a voltage waveform applied to the material to a target voltage waveform.

5. The method of claim 1, wherein the pattern emulates a pushbutton motion.

6. The method of claim 1, wherein the deformable material comprises a transducer.

7. The method of claim 6, wherein the transducer is one of a piezoelectric transducer and a linear resonance actuator.

8. The method of claim 1, wherein the material comprises a polymer muscle fiber.

9. The method of claim 1, further comprising displaying icons on a liquid crystal display such that the predetermined pattern is sensed at the icons.

10. The method of claim 1, further comprising storing one or more digital representations of excitation waveforms for deforming the deformable material according to the predetermined pattern.

11. The method of claim 10, wherein the digital representations are a sequence of voltage and time segments to control a step size and stored as one of segments and splines.

12. The method of claim 11, further comprising:
   dynamically interpolating between segments by adjusting the charging and discharging parameters to determine actual points on the waveform; and
   selecting one of a plurality of waveform signals in response to determining an undershoot in the waveform signal, wherein the peak primary charging current reduces an initial energy transfer to increase a charge rate at high voltages and increases the initial energy transfer in response to determining the undershoot in the waveform signal.

13. The method of claim 1, wherein the deformable material forms part of a touch sensing element that when contacted triggers signals to deform the deformable material.

14. The method of claim 13, wherein the touch sensing element comprises one or more transducers.

* * * * *